United States Patent [19]
Grill et al.

[11] Patent Number: 5,932,907
[45] Date of Patent: Aug. 3, 1999

[54] METHOD, MATERIALS, AND STRUCTURES FOR NOBLE METAL ELECTRODE CONTACTS TO SILICON

[75] Inventors: Alfred Grill, White Plains; David Edward Kotecki, Hopewell Junction; Katherine Lynn Saenger, Ossining, all of N.Y.

[73] Assignee: International Business Machines Corporation, Armonk, N.Y.

[21] Appl. No.: 08/866,459

[22] Filed: May 30, 1997

Related U.S. Application Data

[60] Provisional application No. 60/034,442, Dec. 24, 1996.

[51] Int. Cl.$^6$ ............................ H01L 27/112; H01L 27/04
[52] U.S. Cl. ...................... 257/310; 257/751; 257/769; 257/770; 257/761; 257/754; 257/755
[58] Field of Search .................................. 257/751, 769, 257/770, 761, 300, 754, 755

[56] References Cited

U.S. PATENT DOCUMENTS

| | | | |
|---|---|---|---|
| 5,381,302 | 1/1995 | Sandhu et al. | 361/305 |
| 5,504,041 | 4/1996 | Summerfelt et al. | 437/235 |
| 5,554,866 | 9/1996 | Nishioka et al. | 257/769 |
| 5,652,464 | 7/1997 | Liao et al. | 257/770 |
| 5,739,579 | 4/1998 | Chiang et al. | 257/751 |

FOREIGN PATENT DOCUMENTS

| | | | |
|---|---|---|---|
| 698918 | 2/1996 | European Pat. Off. | H01L 21/3205 |
| 404092468 | 3/1992 | Japan | 257/310 |
| 404167554 | 6/1992 | Japan | 257/310 |

OTHER PUBLICATIONS

C. Harder et al., "Morphology Dependent Platinum Silicide Formation in Oxygen Ambients", Phys. Stat. sol. (a) 146, pp. 385–392 (1994).

S. P. Muraka, "Application of CoSi2 To VLSI and ULSI", Mat. Res. Soc. Symp. Proc. vol. 320,pp. 3–13, (1994).

Use of conducting oxides as a diffusion barrier in shallow junction semiconductor devices. IBM Technical Disclosure Bulletin, vol. 30, No. 8 pp. 436–437, Jan. 1998.

*Primary Examiner*—Peter Toby Brown
*Assistant Examiner*—Hung Van Duong
*Attorney, Agent, or Firm*—Robert M. Trepp

[57] ABSTRACT

A layered structure is described incorporating a noble metal silicide, a noble metal and an oxygen-rich barrier layer between the noble metal silicide and noble metal. A silicon-contributing substrate may also be present in addition to or without the noble metal silicide. The invention overcomes a problem in fabricating capacitors containing high-epsilon dielectric materials or ferroelectric memory elements containing ferroelectric material, namely that silicon diffuses through the electrode in one direction and oxygen diffuses through the electrode in the other direction during the high temperature (400–700° C.) deposition and processing of the dielectric.

29 Claims, 8 Drawing Sheets

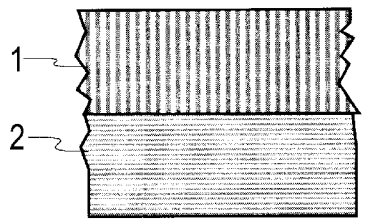 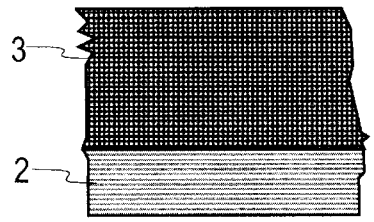 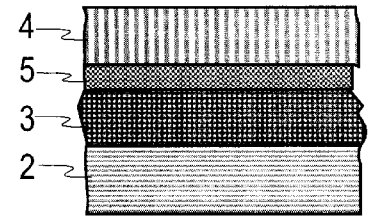
Fig. 1A  Fig. 1B  Fig. 1C
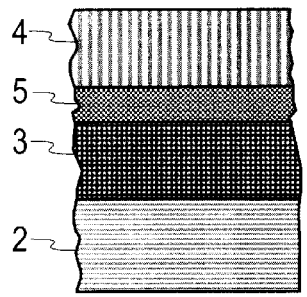 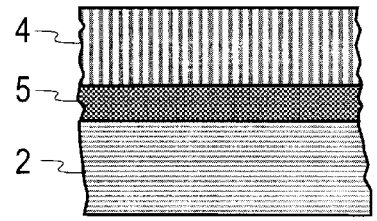
Fig. 2A  Fig. 2B
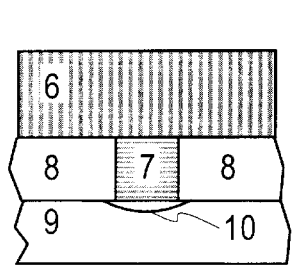 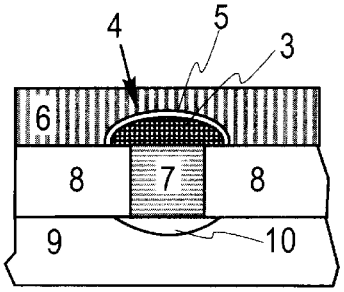 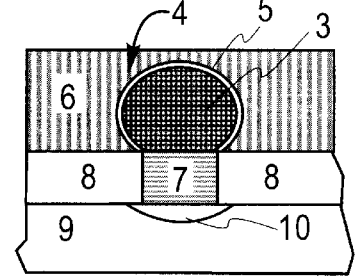
Fig. 3A  Fig. 3B  Fig. 3C

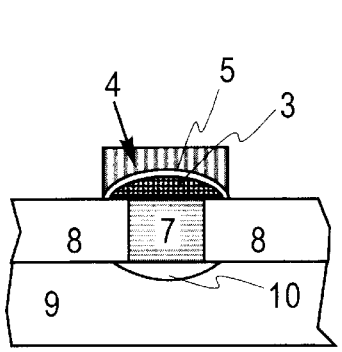
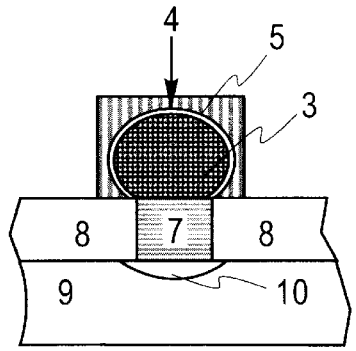
Fig. 4A      Fig. 4B
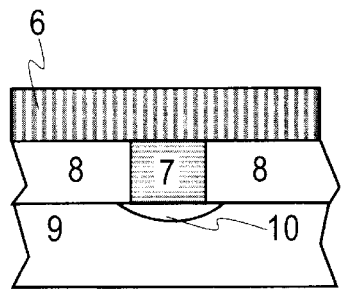
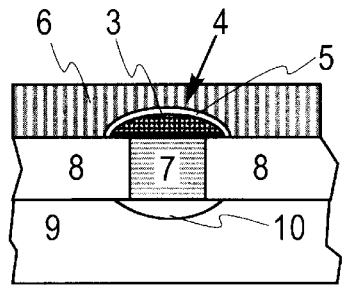
Fig. 5A      Fig. 5B
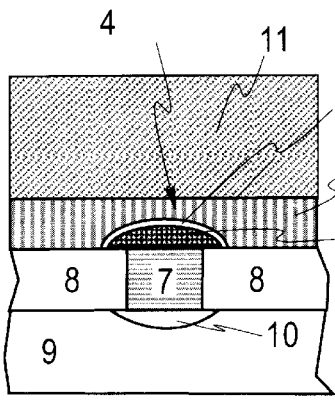
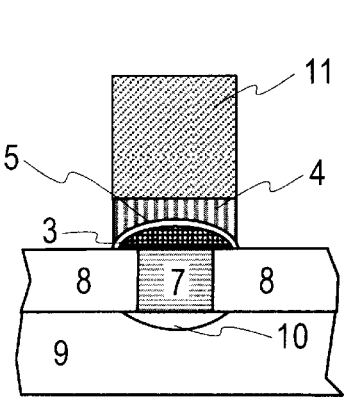
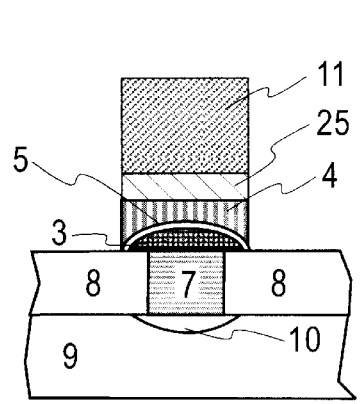
Fig. 5C      Fig. 5D      Fig. 5E // METHOD, MATERIALS, AND STRUCTURES FOR NOBLE METAL ELECTRODE CONTACTS TO SILICON

CROSS-REFERENCE TO RELATED APPLICATION

The present application claims priority to co-pending U.S. provisional application Ser. No. 60/034,442 filed Dec. 24, 1996.

FIELD OF THE INVENTION

This invention pertains to bottom electrode and barrier materials for semiconductor memory devices or thin film capacitors containing ferroelectric or high-epsilon dielectric materials. In particular, the invention pertains to methods, materials, and structures for the use of buried diffusion barriers at the stopped reaction front between silicided and unreacted noble metal formed when noble metals on silicon or silicon-contributing substrates are annealed in oxygen-containing ambients.

BACKGROUND OF THE INVENTION

Most fabrication schemes for memory cell devices incorporating high epsilon materials utilize an electrically conductive diffusion barrier material between the bottom electrode and the silicon contact to prevent (i) contact loss (which may occur if silicon reacts with oxygen diffusing through the bottom electrode during capacitor dielectric deposition to form an electrically insulating layer between the silicon contact and the bottom electrode), and (ii) silicon diffusion to the top surface of the bottom electrode, where the silicon may oxidize to form an undesirable low epsilon layer between the bottom electrode and the memory cell dielectric. The dual requirements that the barrier material be oxidation-resistant (if not electrically conductive in oxidized form) as well as a barrier to both oxygen and silicon diffusion can be quite limiting. For example, TiN and TaN, both viewed as good barriers to silicon diffusion, are not oxidation resistant enough to survive certain types of dielectric processing conditions when used as barriers under Pt electrode layers. In particular, TiN and TaN do not survive the annealing conditions (600–700° C., 760 Torr $O_2$, 1–2 min) typically used in the preparation of high-epsilon materials by sol-gel techniques.

U.S. Pat. No. 5,381,302 which issued on Jan. 10, 1995 to G. S. Sandhu and P. C. Fazan describes barrier layers that can be used between bottom electrodes of non-oxidizing materials (such as Pt) or conductive oxide materials (such as $RuO_2$) and contact layers to silicon consisting of Ti, W, Co, Ta, Mo, or their silicides. The barrier layer materials may be refractory metals, conductive metal oxides, and metal nitrides, including Ta, TiN, TaN, Ti, $RuO_2$, and Ru. Their structures thus contain two layers (a barrier layer and a contact layer) between the bottom electrode and the silicon contact area.

A different approach to the lack of completely suitable barrier materials has been to form a multilayered barrier structure consisting of two or more barrier materials, each barrier material possessing some (but not all) of the desired barrier layer properties. For example, a bilayer barrier structure might consist of an oxidation resistant top layer in contact with the bottom electrode, and an oxidizable diffusion barrier as a bottom layer. U.S. Pat. No. 5,504,041 which issued on Apr. 2, 1996 to S. R. Summerfelt describes such a barrier structure. The oxidation resistant barrier layer may be an exotic nitride such as TiAlN, and the oxidizable diffusion barrier may be a refractory metal, a silicide, or a nitride (such as TiN). Bottom electrode materials described include platinum, palladium, rhenium, rhodium, ruthenium oxide, tin oxide, indium oxide, rhenium oxide, osmium oxide, rhodium oxide, iridium oxide, and combinations thereof.

Still another category of barrier layer materials consists of noble-metal-insulator-alloys such as Pt, Pd, Ru, Re, and Rh alloyed with Si—O or Si—N to form compounds such as Pt—Si—N, Pt—Si—O, Pd—Si—N, Pd—Si—O, etc. These materials are described in European Patent Application EP0698918A1 (S. R. Summerfelt et al.) published on Feb. 28, 1996, and are intended for use as 5–20 Å layers between an oxidizable layer that is substantially conductive and unoxidized, and an oxygen stable layer (such as Pt). These barrier materials are conceptualized as consisting of small particles of noble metal embedded in an oxide or nitride dielectric matrix, with barrier layer conductivity is attributed to tunneling currents between the noble metal particles. Barrier layers of the desired thickness are deposited by reactive sputtering (using, for example, a noble metal silicide target and a low pressure gas mixture of Ar and $O_2$).

Buried, oxygen-containing barrier layers have been previously described by various authors in connection with the undesirable effects of these layers in slowing or stopping desired silicide formation. For example, reliable cobalt silicide ($CoSi_2$) formation by the reaction of Co with a silicon substrate is reported to require native-oxide-free silicon and high purity Co (see, for example, S. P. Muraka, "Applications of $CoSi_2$ to VLSI and ULSI," in Mat. Res. Soc. Symp. Proc., Vol. 320, pp. 3–13, (1994)).

In another example, the effect of oxygen on the formation of platinum silicide from the reaction of Pt with a silicon substrate is reported to depend on Pt morphology and deposition conditions (C. Harder et al., "Morphology Dependent Platinum Silicide Formation in Oxygen Ambients", Phys. Stat. Sol. A Vol. 146 pp. 385–392 (1994)). These references are typical in that incomplete silicide formation is regarded as an undesirable consequence of oxygen contamination, and as something to be avoided.

It is therefore an object of this invention to provide a new type of barrier layer for electrode structures used in the fabrication of devices containing high-epsilon dielectric materials, such as ferroelectric or paraelectric materials.

It is a further object of this invention to teach the use of buried diffusion barriers at the stopped reaction front between silicided and unreacted noble metal formed at the silicide/noble metal reaction front formed when noble metals on silicon or silicon-contributing substrates are annealed in oxygen-containing ambients.

It is a further object of this invention to provide methods and structures for the incorporation of the disclosed buried diffusion barriers into memory devices or capacitors containing high-epsilon dielectric materials.

SUMMARY OF THE INVENTION

This invention teaches the use of a buried diffusion barrier at the stopped reaction front between silicided and unreacted noble metal formed at the silicide/noble metal reaction front created when noble metals on silicon or silicon-contributing substrates are annealed in an oxygen-containing ambient. This buried diffusion barrier stops the silicidation reaction before the noble metal is completely consumed, leaving unreacted, silicon-free noble metal on the electrode surface, and a conductive substrate/silicide interface. This buried diffusion barrier is sufficiently electrically conductive, and is stable to post-formation annealing in oxygen-free ambients. Silicide formation (which may cause undesirable surface roughening) is minimized by depositing the noble metals as thin (50 Å–1000 Å) layers. The disclosed silicide/barrier/ noble metal structures can be incorporated into electrode structures as a finish coating on pre-patterned electrode infrastructures, or as a primer layer for a subsequent thicker noble metal deposition.

BRIEF DESCRIPTION OF THE DRAWING

These and other features, objects, and advantages of the present invention will become apparent upon consideration of the following detailed description of the invention when read in conjunction with the drawing in which:

FIGS. 1A–1C show cross-sectional views of noble metal films on silicon or silicon-contributing substrates before annealing, after annealing in an oxygen-free ambient, and after annealing in an oxygen-containing ambient, respectively.

FIG. 2A shows a close-up of a composite layer structure consisting of a diffusion barrier formed between an unreacted noble metal layer and a noble metal silicide layer;

FIG. 2B shows the structure of FIG. 2A for the limiting case of a zero-thickness silicide layer;

FIGS. 3A–3C show the steps for forming a composite layer structure formed on a silicon or silicon-contributing region of a substrate comprising regions that are silicon or silicon-contributing and regions that are not silicon or silicon-contributing;

FIGS. 4A and 4B show simple electrodes containing the composite layer structure of the present invention, produced by patterning the structures of FIGS. 3B and 3C;

FIGS. 5A–5D show one embodiment of a preferred two-step method for fabricating electrodes based on the blanket deposition of a thick layer of noble metal over a previously formed composite layer structure; FIG. 5E shows the structure resulting from a variation of the preferred two-step method.

DESCRIPTION OF THE PREFERRED EMBODIMENTS

Figure 6A:
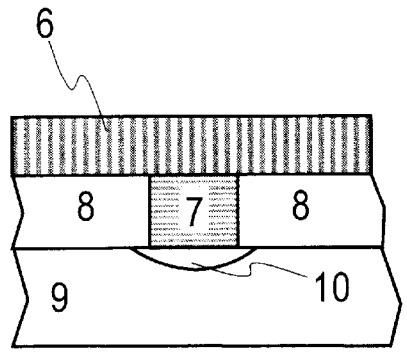
FIGS. 6A–6F show another embodiment of a preferred two-step method for fabricating electrodes based on through-mask plating to form noble metal electrodes over a previously formed composite layer structure.

FIGS. 1A–1C show cross-sectional views of noble metal films on silicon or silicon-contributing substrates 2 before annealing (FIG. 1A), after annealing in an oxygen-free ambient (FIG. 1B) and after annealing in an oxygen-containing ambient (FIG. 1C). FIG. 1A shows as-deposited noble metal layer 1 on silicon or silicon-contributing substrate 2. Silicon-contributing substrates 2 may be, for example, silicon-germanium, silicides and ternary compounds of silicon. Substrate 2 may be much thicker than as shown in FIGS. 1A–1C, which is not drawn to scale.

The silicided structure of FIG. 1B with noble metal silicide layer 3 on silicon or silicon-contributing substrate 2 is readily formed by annealing the structure of FIG. 1A in an inert gas such as Ar or $N_2$. Typical annealing temperatures and times are 300°–700° C. for 0.5 to 30 min; the optimum annealing conditions within this range are determined by the noble metal type and thickness. However, the presence of oxygen (or oxygen-containing species such as $N_2O$) in the annealing gas, or as a contaminant in the deposited metal, can slow or stop this silicidation reaction before the noble metal is completely silicided. During annealing, oxygen piles up at the reaction front boundary between silicided and unreacted noble metal, producing a barrier which prevents any further consumption of the unreacted noble metal. Annealing the structure of FIG. 1A in an oxygen-containing ambient thus produces the incompletely silicided structure of FIG. 1C containing unreacted noble metal 4, barrier layer 5, and silicided noble metal 3. Once formed, barrier layer 5 is quite stable, as indicated by the fact that the same inert gas anneal used to produce the structure of FIG. 1B has no further effect on the barrier-containing structure of FIG. 1C.

FIG. 2A shows a close-up of a composite layer structure consisting of a diffusion barrier 5 between unreacted noble metal layer 4 and noble metal silicide layer 3. This 3-layer structure forms the "composite layer structure" of the present invention. FIG. 2B shows the composite layer structure of FIG. 2A on silicon or silicon-contributing substrate 2 for the limiting case of a zero-thickness silicide layer, where diffusion barrier 5 is directly in contact with the substrate. Such a structure may be formed when the barrier layer forms at the noble metal/substrate interface before silicon diffuses from the substrate.

The silicon or silicon-contributing materials on which this composite layer structure may be formed include doped polysilicon, single crystal silicon, amorphous silicon, tungsten silicide (W $Si_{1.8-3.0}$), titanium silicide, tantalum silicide, cobalt silicide, any other conductive silicide, and any other materials which may form silicides with an adjacent noble metal. These silicon or silicon-contributing materials may further include a layer of native oxide, typically 1.5 nm or less in thickness. The composite layer structure may also be formed on any of the aforementioned silicon or silicon-contributing materials disposed under an electrically conductive, silicon-permeable layer which does not itself contribute silicon to the silicidation reaction.

For example, this silicon permeable layer may be a refractory nitride such as TiN or TaN that is not thick enough to stop silicon diffusion into the noble metal. Alternatively, the permeable barrier layer may be a silicide which remains intact throughout the composite layer formation, by a mechanism in which any silicon lost by reaction with the overlying noble metal is replaced by silicon from the underlying silicon or silicon-contributing substrate.

The noble metal incorporated into the composite layer structure may be initially disposed as one or more layers of the pure noble metals Pt, Ir, Ru, Re, Rh, Pd, Os, Au, Ag, alloys of these noble metals with noble or non-noble metals, and oxides of these noble metals or noble metal alloys. One preferred alloy for the as-disposed noble metal is Ir—Pt, which combines Pt (a noble metal with a relatively high resistance to oxidation) and Ir (a noble metal with a relatively high resistance to silicidation). One preferred bilayer combination for the as-disposed noble metal comprises an upper layer of Pt (a noble metal with a relatively high resistance to oxidation) and a lower layer of Ir (a noble metal with a relatively high resistance to silicidation). As initially disposed, the aforementioned noble metals and alloys may also contain oxygen impurities incorporated during deposition. For example, oxygen impurities may be deliberately incorporated into noble metals and alloys by sputter depositing these materials in oxygen-containing ambients.

The noble metal silicide of the composite layered structure may have a single, uniform, stoichiometric composition, or be a homogeneous or inhomogeneous mixture of two or more stoichiometric or non-stoichiometric silicides.

FIGS. 3A–3C show how the composite layer structure might be formed on the silicon or silicon-contributing regions of a substrate comprising regions that are silicon or silicon-contributing, and regions that are not silicon or silicon-contributing. FIG. 3A shows noble metal layer 6 deposited on a substrate consisting of conductive silicon or silicon-contributing plug regions 7 and dielectric regions 8 that are not silicon or silicon-contributing. Conductive plug 7 is embedded in dielectric layer 8; plug 7 and dielectric layer 8 are disposed on semiconductive or insulating substrate 9 having conductive regions 10 at least partially in register with conductive plug 7. Dielectric 8 may be $SiO_2$, and conductive plug 7 may be doped polysilicon. Noble metal layer 6 may be thick or thin. After annealing in an oxygen-containing ambient, one obtains the composite layer structure of FIG. 2A above each plug region. The incorporated composite layer structure is shown in FIG. 3B for the case of a thin noble metal, and in FIG. 3C for the case of a thicker noble metal. Note that the originally deposited noble metal 6 remains intact above the dielectric regions 8 of the substrate. Formation of noble metal silicide 3 (which may cause undesirable roughening) can be minimized by depositing the noble metals as thin (100–1000 Å) layers.

FIGS. 4A and 4B show simple electrodes containing the composite layer structure of the present invention, produced by patterning the structures of FIGS. 3B and 3C by a process such as ion beam etching or reactive ion etching. The structures shown in FIGS. 4A and 4B were produced from the structures shown in FIGS. 3B and 3C, respectively. While simple, this method has the disadvantage that the electrode height cannot be increased without concurrently increasing the amount of silicide formed. Silicide formation contributes to roughness and stress, and therefore should be minimized.

FIGS. 5A–5D show one embodiment and a preferred method for fabricating electrodes containing the composite layer structure. This method is based on the blanket deposition of a thick layer of noble metal on a substrate containing a pre-existing composite layer barrier structure previously formed with a thin layer of noble metal. As in FIG. 3A noble metal layer 6 is deposited on a substrate containing conductive silicon or silicon-contributing plug 7 embedded in dielectric 8 as shown in FIG. 5A. After annealing in an oxygen-containing ambient to form the composite layer structure above plug 7 shown in FIG. 5B, noble metal layer 11 is deposited as shown in FIG. 5C. FIG. 5D shows the completed electrode structure after patterning of noble metal layers 6 and 11 by a process such as reactive ion etching. Noble metal 11 may be the same or different from noble metal 6. Noble metal 6 would typically be relatively thin (for example, 100–500 A) to minimize the thickness of the silicide in the composite layer structure. However, noble metal 11 may be relatively thick (1000–5000 A) when the composite barrier layer formed from noble metal layer 6 protects noble metal 11 from silicidation. This would be the case, for example, if noble metal layers 6 and 11 were both Pt.

A variation of the two-step method of FIGS. 5A–5D may be preferred in cases wherein layer 6 is a noble metal such as Ir and layer 11 is a different noble metal such as Pt. Since Ir and Pt can readily interdiffuse, Pt can reach the diffusion barrier layer of the Ir-based composite layer structure and destructively react with it. This problem can be avoided by oxidizing the exposed top Ir surface of the Ir-based composite layer structure to form a layer of conductive $IrO_2$ prior to Pt deposition. While $IrO_2$ formation may occur naturally during the oxygen-based anneal required to form the composite layer, increased annealing times may be necessary to insure an $IrO_2$ layer thickness sufficient to act as a barrier to Pt diffusion. For example, a 15 second anneal at 640 C. in an atmospheric pressure of $O_2$ may be sufficient to form a stable composite layer structure in an Ir/Si structure, whereas a 2 minute anneal at the same conditions would be necessary to form an $IrO_2$ layer of sufficient thickness to act as a diffusion barrier. An electrode structure resulting from this process variation is shown in FIG. 5E, which is identical to the electrode structure of FIG. 5D except for the presence of conductive oxide layer 25. While conductive noble metal oxide layer 25 has been described for the case of $IrO_2$, this oxidation method for forming noble metal oxide diffusion barriers applies equally well to any other noble metals forming stable conductive oxides.

Figure 6D:
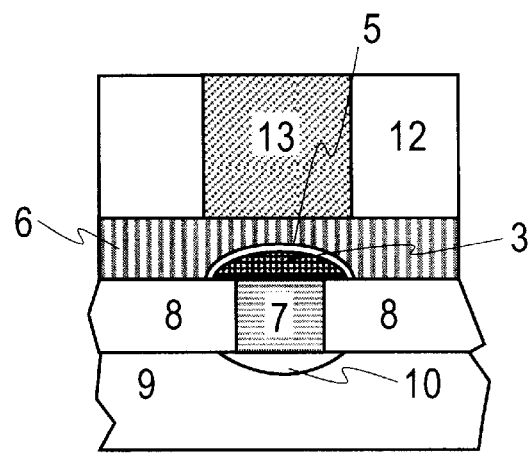
Figure 6B:
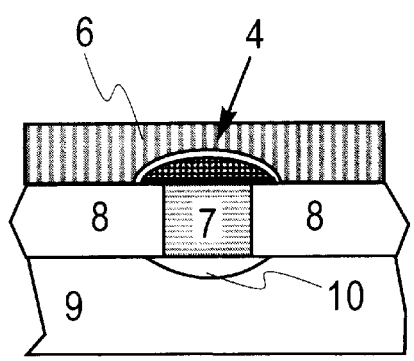
Figure 6E:
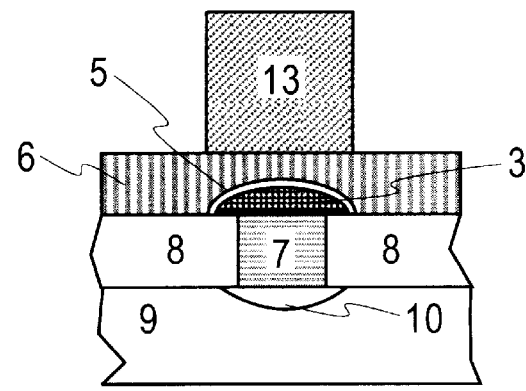
Figure 6C:
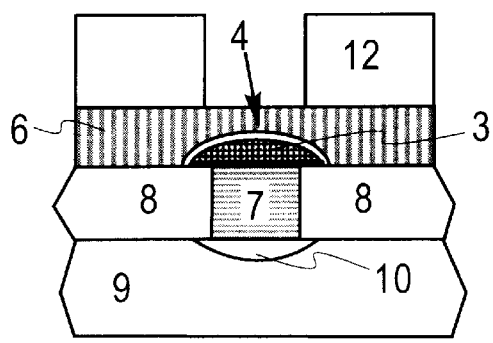
Figure 6F:
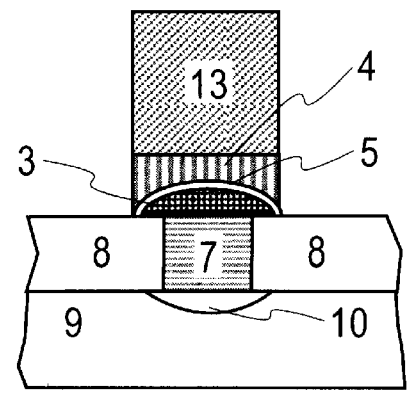

FIGS. 6A–6F show another embodiment and a preferred method for fabricating electrodes based on through-mask plating of noble metal electrodes over a previously formed composite layer structure contained in a plating base. As in FIG. 3A, thin noble metal 6 is deposited on a substrate containing conductive silicon or silicon-contributing plug 7 embedded in dielectric 8 as shown in FIG. 6A. The structure of FIG. 6A is then annealed in an oxygen-containing ambient to form the composite layer structure above plug 7, leaving connected noble metal regions 4 and 6 as a plating base. Mask material 12 is next applied and patterned as shown in FIG. 6C to leave openings where material is to be electrodeposited. Mask material 12 should be insulating, and compatible with the plating solution. Possible mask materials include organic photoresists and diamond-like carbon. After electroplating a noble metal as shown in FIG. 6D, the mask material is removed as shown in FIG. 6E. Finally, those portions of the plating base previously covered by the mask material are removed (by a process such as ion beam or reactive ion etching) to leave the structure of FIGS. 5D and 6F. The plating method of FIGS. 6C–6F might be preferred to the subtractive patterning method of FIGS. 5C and 5D because the plating method avoids a thick noble metal etch. As was discussed in the context of FIGS. 5A–5D, noble metal 6 may also have an oxidized surface region or over layer to act as a diffusion barrier between the unreacted noble metal 6 and plated noble metal 13.

Figure 7A:
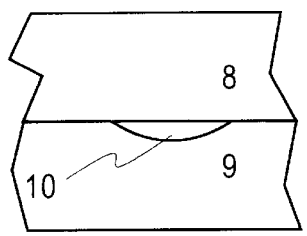
FIGS. 7A–7I show the steps to fabricate a compound stack electrode structure comprising the composite layer structure of the present invention formed as a coating on a pre-patterned electrode infrastructure.
Figure 7B:
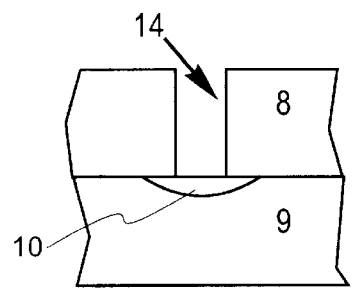
Figure 7C:
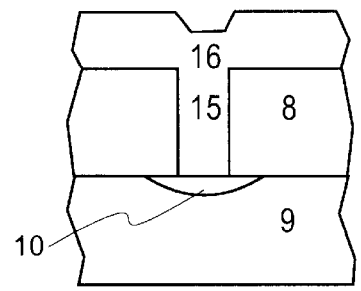
Figure 7D:
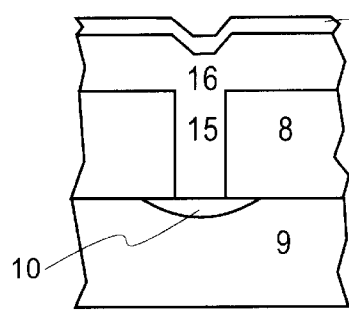

FIGS. 7A–7I show steps to fabricate a compound stack electrode structure comprising the composite layer structure of the present invention formed as a coating on a pre-patterned electrode infrastructure. The steps to form a patterned electrode infrastructure are shown in FIGS. 7A–7E. A dielectric layer 8 is first deposited on a semiconductive or insulating substrate 9 having conductive regions 10 shown in FIG. 7A. A contact via hole 14 is then etched in dielectric 8 as shown in FIG. 7B. Conductive silicon or silicon-contributing material (for example, doped polysilicon) is then deposited for the plug 15 and interior electrode infrastructure 16 as shown in FIG. 7C, followed by deposition of a capping layer 17 as shown in FIG. 7D. Capping layer 17 may be conductive or non-conductive; a suitable capping layer would be $SiO_2$. Capping layer 17 and interior electrode infrastructure 16 are then patterned (by a process such as reactive ion etching) to form the patterned electrode infrastructure of FIG. 7E.

Figure 7E:
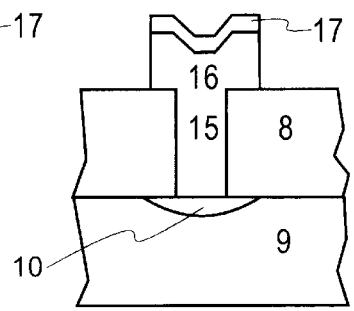

The electrode infrastructure of FIG. 7E is provided only as an example, and not meant to be restrictive or limiting. For example, alternative electrode infrastructures might be formed by replacing capping layer 17 by a multilayer stack, and/or conductive plug 15 might be formed using a material different from the material of electrode infrastructure 16. However, the patterned electrode infrastructure must have at least one exterior silicon or silicon-contributing surface in electrical contact with the contact plug 15.

Figure 7F:
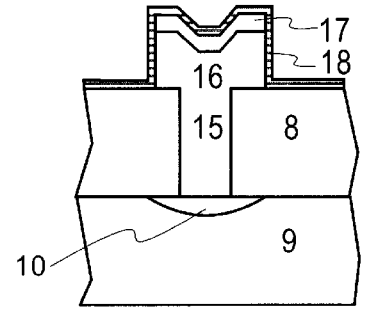
Figure 7G:
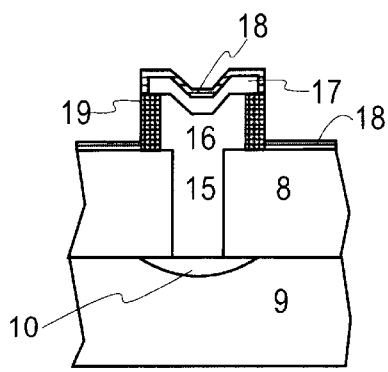
Figure 7H:
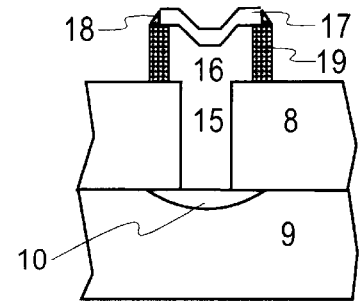
Figure 7I:
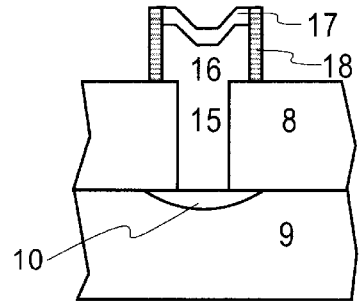

The steps to form the composite layer structure as a coating on the pre-patterned electrode infrastructure of FIG. 7E are shown in FIGS. 7F–7H. Noble metal layer 18 is conformally deposited to form the structure of FIG. 7F. The structure is then annealed in an oxygen-containing ambient to form the structure of FIG. 7G, containing composite noble metal/barrier/silicide layer structure 19. An anisotropic sidewall spacer etch (for example, by a process such as ion beam or reactive ion etching) removes the horizontal portions of the original noble metal to leave the completed compound stack electrode structure as shown in FIG. 7H. The structure of FIG. 7H could also be produced by performing the anisotropic sidewall spacer etch on the structure of FIG. 7F to produce the structure of FIG. 7I, and then annealing in an oxygen-containing ambient to produce the completed compound stack electrode structure of FIG. 7H.

Figure 8A:
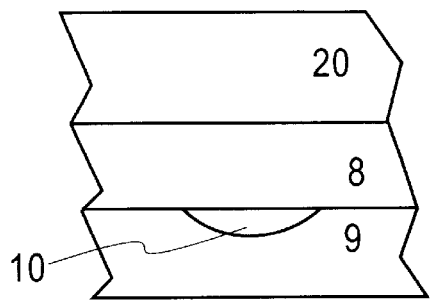
FIGS. 8A–8F show the steps to form an alternative stack electrode infrastructure which can also be coated with the the composite layer structure of the present invention to form another embodiment of a compound stack electrode structure.
Figure 8B:
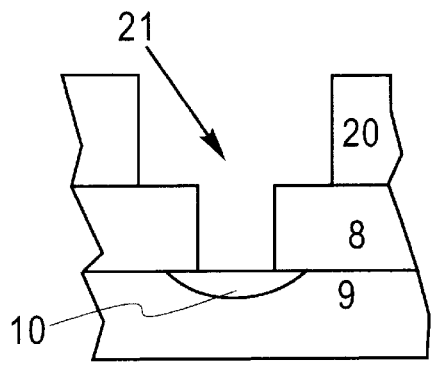
Figure 8C:
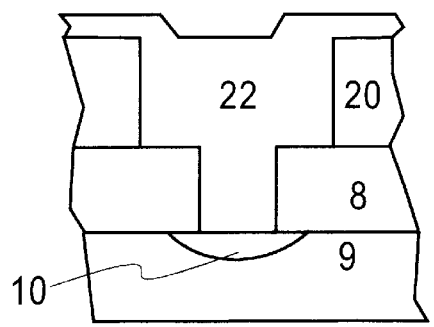
Figure 8D:
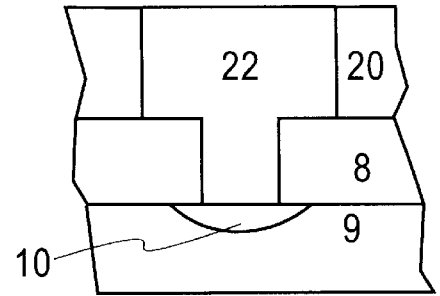
Figure 8E:
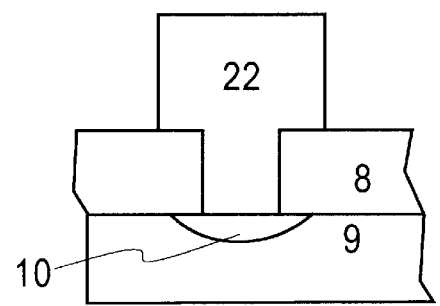
Figure 8F:
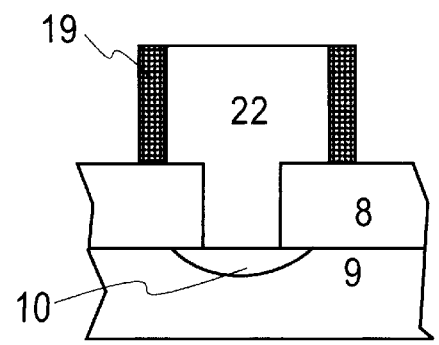

FIGS. 8A–8F show the steps to form an alternative stack electrode infrastructure which can also be coated with the the composite layer structure of the present invention to form another embodiment of a compound stack electrode structure. FIG. 8A shows a semiconductive or insulating substrate 9 having conductive regions 10 after deposition of dielectric layer 8 and disposable layer 20. The materials of disposable layer 20 and dielectric layer 8 may be the same or different. An additional layer (not shown) between layers 8 and 20 may be optionally used as an etch stop. FIG. 8B shows layers 20 and 8 after Dual Damascene patterning to form a "countersunk" cavity 21. Cavity 21 is filled with a conductive silicon or silicon-contributing material 22 as shown in FIG. 8C and planarized by a process such as chemical mechanical polishing to produce the structure of FIG. 8D. Material 22 may be, for example, doped polysilicon or tungsten silicide. Layer 20 is then recessed to expose the upper portion of layer 22, forming the stack electrode infrastructure of FIG. 8E. Proceeding as previously shown in FIGS. 7F to 7I, one conformally deposits a thin layer of noble metal 18 on the stack electrode infrastructure. Noble metal 18 is then annealed and given an anisotropic sidewall spacer etch (or alternatively, given an anisotropic sidewall spacer etch and then annealed) to form the completed compound stack electrode structure of FIG. 8F containing composite barrier layer structure 19.

Figure 9A:
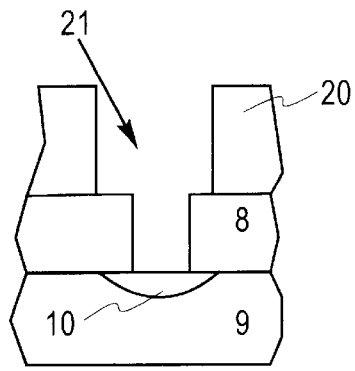
FIGS. 9A–9J show an alternative set of steps to fabricate yet another embodiment of a compound stack electrode structure comprising the composite layer of the present invention.

FIGS. 9A–9J show an alternative set of steps to fabricate yet another embodiment of a compound stack electrode structure comprising the composite layer structure 19. FIG. 9A shows the layers 20 and 8 of FIG. 8B after Dual Damascene patterning to form a countersunk cavity 21. Disposable layer 20 and cavity 21 are coated with a thin layer of conformally deposited noble metal 23. FIGS. 9C–9F show one method of completing the structure to make the compound stack electrode of FIG. 9F. First, a conductive silicon or silicon-contributing material 22 is deposited and planarized by a process such as chemical mechanical polishing to produce the structure of FIG. 9C. Material 22 may be, for example, doped polysilicon or tungsten silicide. The exposed horizontal portions of noble metal layer 23 are then removed by a process such as reactive ion etching to form the structure of FIG. 9D. Layer 20 is then recessed to form the structure of FIG. 9E, which is annealed in an oxygen-containing ambient to form the completed compound electrode structure of FIG. 9F containing composite barrier layer structure 19. This method has the feature that the silicon or silicon-containing material contributing to the composite barrier layer structure is deposited onto a noble metal layer which is deposited first. This contrasts with the previous methods shown, in which the noble metal layer is deposited onto a previously deposited silicon or silicon-contributing material.

Figure 9B:
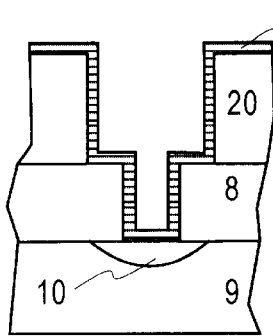
Figure 9C:
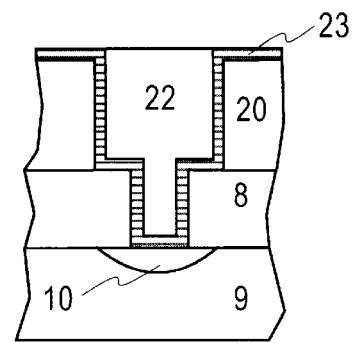
Figure 9D:
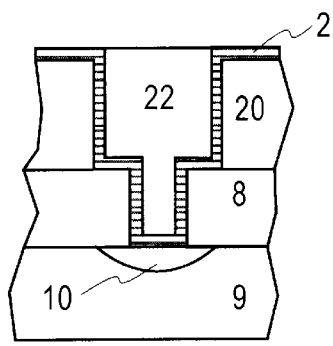
Figure 9E:
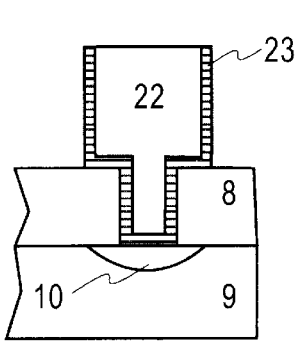
Figure 9F:
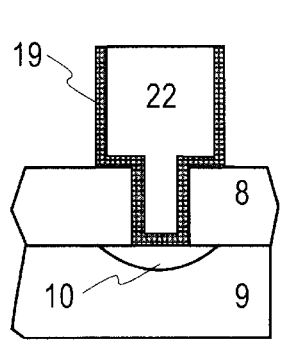
Figure 9G:
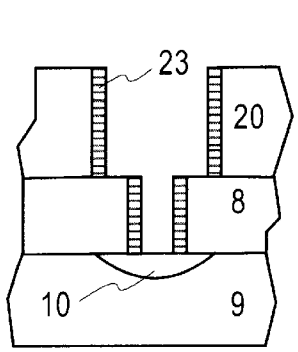
Figures 9H, 9I:
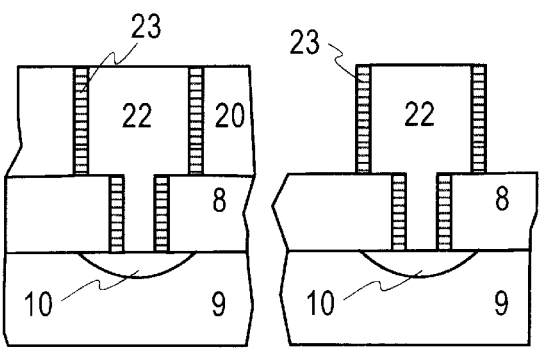
Figure 9J:
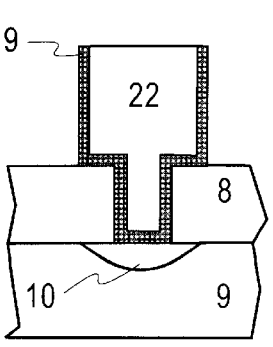

FIGS. 9G–9J show another method of completing the structure of FIG. 9B to make the compound stack electrode structure of FIG. 9J. FIG. 9G shows the structure of 9B after an anisotropic sidewall spacer etch of noble metal layer 23. A conductive silicon or silicon-contributing material 22 is then deposited and planarized by a process such as chemical mechanical polishing to produce the structure of FIG. 9H. Material 22 may be, for example, doped polysilicon or tungsten silicide. Layer 20 is then recessed to form the structure of FIG. 9I, which is annealed in an oxygen-containing ambient to form the completed compound electrode structure of FIG. 9J containing composite barrier layer structure 19. In both FIG. 9 methods, disposable layer 20 is preferably removed as shown in FIGS. 9E and 9I prior to the annealing step to improve oxygen access to the noble metal surface under which barrier layer formation takes place.

A capacitor or ferroelectric memory element containing a high epsilon dielectric or ferroelectric material may be constructed using the electrodes of FIGS. 3–9. Examples of high-epsilon dielectrics include barium strontium titanate and lead lanthanum titanate; examples of ferroelectric materials include lead zirconium titanate (PZT) and barium titanate.

Figure 10A:
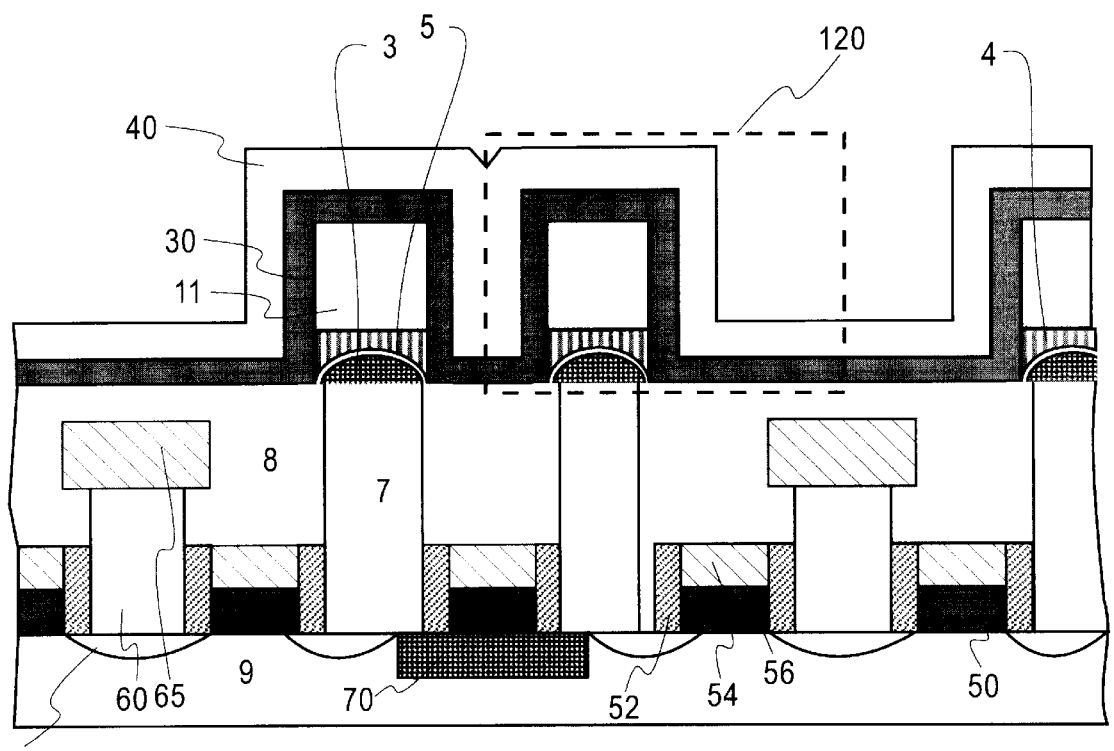
FIG. 10A is a cross-sectional view and FIG. 10B is a top view of an array of capacitors incorporating the disclosed barrier layer, illustrating how such capacitor arrays might be used in a DRAM or FRAM.
Figure 10B:
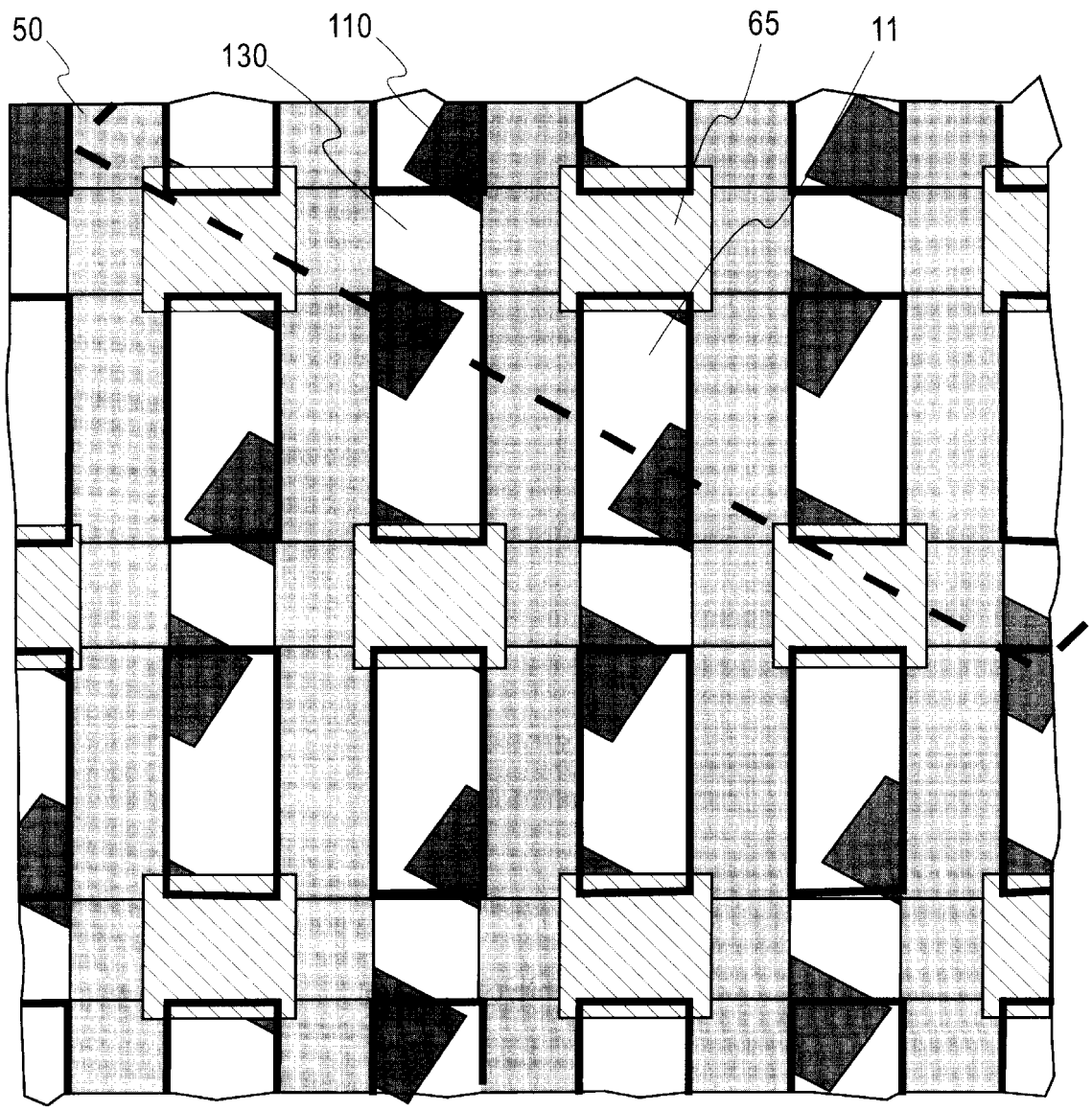

FIG. 10A is a cross sectional view and FIG. 10B is a top view of an array of capacitors 118, each capacitor incorporating the disclosed barrier layer, illustrating how such capacitor arrays 118 might be used to form a DRAM or FRAM 122. Capacitors 120 incorporate the bottom electrode structure of FIG. 5D, comprising bottom electrode component layers 4 and 11, high-permittivity dielectric 30, and plate electrode 40. Bottom electrode layers 4 and 11 are connected via barrier layer 5, noble metal silicide 3, and plug 7 to a diffusion region 10 in the substrate 9. Charge is transferred between bit lines 65 and capacitor 120 through bit line contacts 60 and diffusion region 10 by the transfer device 80.

Transfer device 80 may be an MOS field effect transistor (FET) where respective diffusion regions 10 form the source and drain and where silicon dioxide 50 forms the gate dielectric below wordline 90. The gate stack of transfer device 80 includes wordline 90, gate oxide 50, and insulating sidewall spacers 52.

Wordline 90 consists of conductor 54 and silicide 56. Adjacent transfer devices 80 with diffusion regions 10 are separated from each other by isolation regions 70.

Similar DRAM's and FRAM's could also be built with capacitors with a bottom electrode corresponding to the structures of FIGS. 6F, 7H, 7I, 8F, and 9J.

Two examples of the composite layer structure of FIG. 2A are Pt on a silicon-contributing layer of $WSi_{2.8}$, and Ir on a silicon substrate of single-crystal silicon. Samples of Pt(200 Å)/$WSi_{2.8}$ and Ir(200 Å)/Si were annealed in oxygen for times ranging from 10 s to 6 min. The Ir and Pt remaining after the oxygen anneals remained even after a subsequent anneal in oxygen-free nitrogen at 640° C. for 6 min, an anneal which would ordinarily completely convert the Ir or Pt to a silicide. This indicates that the oxygen-rich buried barrier layer is extremely stable. The temperature for forming the composite layer structure may be lower, higher, or the same as the highest temperature of dielectric deposition and processing. However, the stability of the composite layer structure may be compromised if it is exposed to temperatures that are much higher than the composite layer formation temperature.

While there has been described and illustrated a composite layer structure containing an oxygen-rich barrier layer acting as a barrier to silicon diffusion such as at temperatures necessary for depositing and processing of high dielectric constant materials for fabricating DRAM and FRAM capacitors, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A composite layer structure comprising:
    a noble metal silicide;
    a noble metal; and
    an oxygen-rich barrier layer at a stopped reaction front between said noble metal and said noble metal silicide;
    said oxygen-rich barrier layer acting as a barrier to silicon diffusion and formed subsequent to deposition of said noble metal.

2. The composite layer structure of claim 1 wherein said noble metal silicide is a layer disposed on a substrate containing a conductive material selected from the group consisting of silicon, silicon-germanium, silicides, and ternary compounds of silicon.

3. The composite layer structure of claim 1 wherein said noble metal silicide is a layer disposed on first conductive regions of a substrate, said substrate having a surface comprising said first conductive regions of a material selected from the group consisting of silicon, silicon-germanium, silicides, and ternary compounds of silicon and a second region of an insulator.

4. The composite layer structure of claim 1 wherein said noble metal silicide has a thickness in a range from about 2 to about 500 nm.

5. The composite layer structure of claim 3 wherein said noble metal silicide has a thickness less than 2 nm, and wherein said oxygen-rich barrier layer is between said noble metal and said conductive regions of said substrate.

6. The composite layer structure of claim 1 wherein said noble metal forms an exterior surface of an electrode structure.

7. The composite layer structure of claim 6 wherein said noble metal forms a first layer and further including a second layer of a second noble metal disposed on said first layer.

8. The composite layer structure of claim 7 wherein said second noble metal is selected from the group consisting of Pt, Ir, Ru, Re, Rh, Pd, Os, Au, Ag, alloys of these metals with noble or non-noble metals, layered combinations of these metals, oxides of these noble metals and oxides of noble metal alloys.

9. The composite layer structure of claim 1 wherein said noble metal is selected from the group consisting of Pt, Ir, Ru, Re, Rh, Pd, Os, Au, Ag, alloys of these noble metals with noble or non-noble metals, layered combinations of these metals, and oxides of these noble metals and oxides of noble metal alloys.

10. The composite layer structure of claim 1 wherein said noble metal includes oxygen impurities.

11. The composite layer structure of claim 1 wherein said noble metal includes oxygen impurities incorporated during deposition of said noble metal.

12. The composite layer structure of claim 1 wherein said noble metal includes oxygen impurities incorporated by ion implantation.

13. The composite layer structure of claim 1 further including a substrate of conductive material in contact with said noble metal silicide, said substrate material selected from the group consisting of doped polysilicon, single crystal silicon, amorphous silicon, polycrystalline silicon-germanium, single crystal silicon-germanium, amorphous silicon-germanium, tungsten silicide ($WSi_{1.8-3.0}$), and cobalt silicide.

14. The composite layer structure of claim 13 wherein said conductive substrate further includes a layer of oxide less than 1.5 nm thick on its surface.

15. The composite layer structure of claim 2 further including an electrically conductive, silicon-permeable layer which does not itself contribute silicon to a silicidation reaction of said noble metal silicide, said silicon permeable layer disposed between conductive regions of said substrate and said noble metal silicide.

16. A compound electrode structure comprising:
    an electrode infrastructure containing at least one exterior surface of a conductive material selected from the group consisting of silicon, silicon-germanium, silicides and ternary compounds of silicon,
    a noble metal silicide disposed on said exterior electrode infrastructure surfaces,
    a noble metal disposed on said noble metal silicide, said noble metal forming outer surfaces of said compound electrode structure and
    an oxygen-rich barrier layer at a stopped reaction front between said noble metal and said noble metal silicide,
    said oxygen-rich barrier layer acting as a barrier to silicon diffusion, and formed subsequent to deposition of said noble metal.

17. A composite layer structure comprising:
    a conductive substrate selected from the group consisting of silicon, silicon germanium, silicides and ternary compounds of silicon;
    a noble metal; and
    an oxygen-rich barrier layer at a stopped reaction front between said noble metal and said conductive substrate;
    said oxygen-rich barrier layer acting as a barrier to silicon diffusion and formed subsequent to deposition of said noble metal.

18. The composite layer structure of claim 17 wherein said structure is formed as a coating on a pre-patterned electrode infrastructure containing at least one exterior surface of a conductive material selected from the group consisting of silicon, silicon germanium, silicides and ternary compounds of silicon.

19. A composite layer structure comprising:
  a substrate having conductive regions of a material selected from the group consisting of silicon, silicon germanium, silicides and ternary compounds of silicon;
  a noble metal; and
  an oxygen-rich barrier layer at a stopped reaction front between said noble metal and said conductive regions;
  said oxygen-rich barrier layer acting as a barrier to silicon diffusion and formed subsequent to deposition of said noble metal.

20. The composite layer structure of claim 19 wherein said noble metal forms the exterior surface of an electrode structure.

21. The composite layer structure of claim 20 wherein said noble metal forms a first layer and further including a second layer of a second noble metal disposed on the top surface of said first layer.

22. A composite layer structure comprising:
  a noble metal silicide;
  a noble metal;
  an oxygen-rich layer at a reaction front interface of said noble metal and said noble metal silicide;
  said oxygen-rich layer acting as a barrier to silicon diffusion and formed by the steps of
    depositing a layer of noble metal on a substrate surface;
    disposing a material selected from the group consisting of silicon, silicon-germanium, silicides and ternary compounds of silicon on some or all of said noble metal layer; and
    heating in an oxygen-containing ambient.

23. A capacitor comprising:
  a first electrode comprising a noble metal silicide;
  a noble metal; and
  an oxygen-rich barrier layer at a stopped reaction front between said noble metal and said noble metal silicide;
  said oxygen-rich barrier layer acting as a barrier to silicon diffusion;
  a high dielectric constant material having an epsilon over 20 adjacent to said noble metal of said first electrode, and
  a second electrode adjacent to said high dielectric constant material.

24. The capacitor of claim 23 wherein said noble metal forms a first layer and further including a second layer of a second noble metal disposed on the top surface of said first layer.

25. A capacitor comprising:
  an electrode infrastructure containing at least one exterior surface of a conductive material selected from the group consisting of silicon, silicon-germanium, silicides and ternary compounds of silicon,
  a noble metal silicide disposed on said exterior electrode infrastructure surfaces,
  a noble metal disposed on said noble metal silicide, said noble metal forming outer surfaces of said compound electrode structure and
  an oxygen-rich barrier layer at a stopped reaction front between said noble metal and said noble metal silicide,
  said oxygen-rich barrier layer acting as a barrier to silicon diffusion, and formed subsequent to deposition of said noble metal,
  a high dielectric constant material having an epsilon over 20 adjacent to said noble metal of said first electrode, and
  a second electrode adjacent to said high dielectric constant material.

26. The capacitor of claim 25 wherein said noble metal forms a first layer and further including a second layer of a second noble metal disposed on the top surface of said first layer.

27. A ferroelectric memory element comprising:
  an electrode infrastructure containing at least one exterior surface of a conductive material selected from the group consisting of silicon, silicon-germanium, silicides and ternary compounds of silicon,
  a noble metal silicide disposed on said exterior electrode infrastructure surfaces,
  a noble metal, said noble metal forming the outer surface of said compound electrode structure and
  an oxygen-rich barrier layer at a stopped reaction front between said noble metal and said noble metal silicide,
  said oxygen-rich barrier layer acting as a barrier to silicon diffusion, and formed subsequent to deposition of said noble metal,
  a ferroelectric material adjacent to said noble metal of said first electrode, and
  a second electrode adjacent to said ferroelectric material.

28. A ferroelectric memory element comprising:
  a first electrode comprising a noble metal silicide;
  a noble metal;
  an oxygen-rich barrier layer at a stopped reaction front between said noble metal and said noble metal silicide;
  said oxygen-rich barrier layer acting as a barrier to silicon diffusion;
  a ferroelectric material adjacent to said noble metal of said first electrode; and
  a second electrode adjacent to said ferroelectric material.

29. The composite layer structure of claim 7 wherein said noble metal forming said first layer is Ir and said second layer of a second noble metal includes a bottom layer of IrO2 and a top layer of Pt.

* * * * *